Dec. 17, 1963 SUSUMU YOSHIDA ETAL 3,114,664

METHOD OF MANUFACTURING ALLOY TYPE TRANSISTOR FOR HIGH FREQUENCY

Filed March 24, 1960

INVENTORS
SUSUMU YOSHIDA
BY TAKANORI KOSHIO

Joseph Weingarten
ATTORNEY

United States Patent Office 3,114,664

Patented Dec. 17, 1963

3,114,664

METHOD OF MANUFACTURING ALLOY TYPE TRANSISTOR FOR HIGH FREQUENCY

Susumu Yoshida and Takanori Koshio, Tokyo, Japan, assignors to Nippon Telegraph & Telephone Public Corporation, Tokyo, Japan, a Japanese firm Filed Mar. 24, 1960, Ser. No. 17,405
Claims priority, application Japan May 6, 1959
2 Claims. (Cl. 148—181)

The invention relates to a method for forming a planar rectifying junction in semiconductor materials and more particularly pertains to a process for manufacturing high frequency alloy type transistors.

One of the common manufacturing methods of improving the high frequency characteristics of transistors is to decrease the thickness of the base region as it is well known that a diminution in base thickness effectively raise the alpha cut off frequency ($f_c\alpha$), that is, the amplifying rate of the current between the collector and emitter is made larger. However, a decrease in the thickness of the base region tends to increase the interelectrode capacitance and in order to minimize the capacity of the collector, it is customary to decrease the junction area. Decreasing the base region thickness has the disadvantage that the punch through voltage between the emitter and collector is lowered.

The invention relates to a method of making high frequency alloy type transistors in which an indium pellet is alloyed with a germanium wafer by heating those members while they are in contact in a vacuum or in an inert gaseous atmosphere. The heating cycle is controlled in a manner such that the indium pellet forms an unsaturated alloy with the germanium of the wafer and the initial alloy layer is shallow. That is, the first stage of the heating cycle causes the indium to wet the surface of the germanium wafer and to spread over that surface while a small amount of the indium penetrates the surface and forms a shallow unsaturated alloy layer on the wafer. In the second stage of the heating cycle, the indium is caused to further alloy with the shallow unsaturated layer until the layer is nearly saturated by the indium. During the second stage of the heating cycle, the indium does not further spread over the surface of the germanium wafer so that the area of the alloy junction is confined to the area wetted by the indium during the first stage of the heating cycle. Since the indium, during the second stage of the heating cycle, does not further spread over the germanium wafer, there is no tendency for the indium to form a convex alloy frontal surface with the germanium wafer, but rather, a flat uniform junction is obtained. Further, by slow cooling, the recrystallized layer can be built up and, if the process is carried on in vacuum, the gases liberated or generated during the heating period can be drawn away to prevent their occlusion in the alloy.

The procedure for carrying out the novel manufacturing process can be better apprehended by a perusal of the following exposition, to be considered in conjunction with the accompanying drawing in which.

Figure 1:
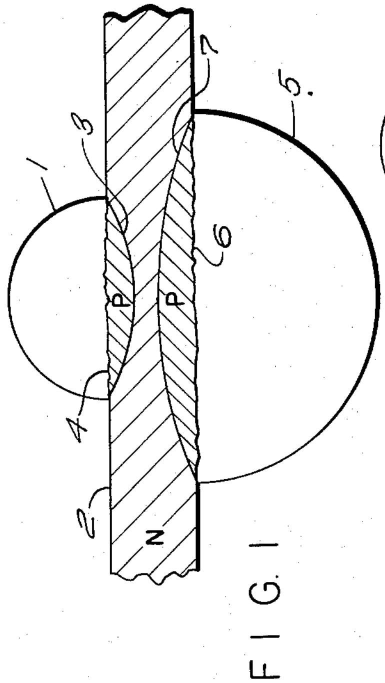
FIG. 1 is a cross section of a conventional alloy junction transistor.

Referring now to FIG. 1, there is shown a conventional type of alloy junction transistor in which the emitter 1

(commonly a pellet of indium) has been alloyed with a wafer of N-type germanium 2 in a manner such that a convex or bowl-shaped junction 3 has been formed between the recrystallized P-type In—Ge alloy 4 and the N-type wafer. The collector 5 may also be a pellet of indium, albeit of somewhat larger size. The distinguishing difference, if there be any, between the emitter and collector is that the emitter may be more heavily doped than the collector. The collector pellet 5 is caused to alloy with the N-type germanium base to form a P-type alloy 6 whose junction 7 with the wafer is bowl-shaped or convex. The punch through voltage of the transistor of FIG. 1 is determined by the least distance between the junction 3 and the junction 7. It is known that as the base thickness is made smaller, the reverse (normal) collector voltage causes the collector depletion layer to penetrate more effectively into the base region, towards the emitter. When the collector depletion layer actually makes contact with the emitter depletion layer, the effective base width becomes zero, the base region ceases to exist, normal transistor action ends, and punch through is said to have occurred. The minimum base width between junctions 3 and 7 determines the punch through voltage; that is, the distance between the closest two points on the convex junctions 3 and 7 sets the punch through voltage. The width of the base 2 between any other two points is always wider and the transit times of carriers injected into the base from the emitter in reaching the collector are, on the average, longer than the transit time between the nearest two points, for that reason the alpha cut-off frequency $f_c\alpha$ of the conventional alloy junction transistor cannot readily be increased.

Figure 2:
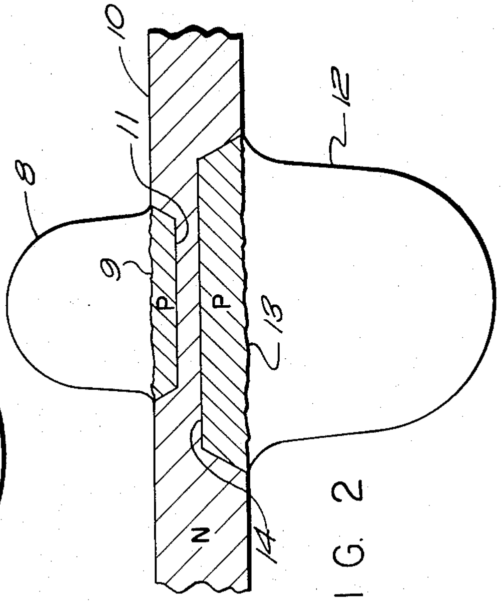
FIG. 2 is a cross section of an alloy transistor constructed in accordance with the method of the invention.

Consider now FIG. 2 which illustrates an alloy junction transistor having uniformly flat rectifying junctions. The indium emitter pellet 8 has been caused to alloy with the N-type germanium in a manner such that the P-type alloy 9 meets the germanium wafer 10 in a planar junction 11. The collector pellet 12 also has been caused to alloy with the base so that the P-type alloy 13 forms a planar interface 14 with the base. Since the two junctions or interfaces 11 and 14 are uniformly flat, the base thickness between any two opposed points of the interfaces is constant. Since the separation of the junctions is uniform, neglecting the edges, there is no distribution of transit times as is the case in the transistor of FIG. 1. It is therefore possible to obtain a marked improvement in the alpha cut-off frequency ($f_c\alpha$) of the transistor of FIG. 2 by decreasing the base thickness to the extent desired, up the limitation in thickness imposed by the punch through voltage.

At the present time, two methods are known for manufacturing planar junctions of the type illustrated in FIG. 2. In one of those methods, an organic flux is employed on the surface of the germanium wafer to aid the indium in completely wetting the wafer's surface while the parts are at low temperature. Thereafter the temperature is raised slowly while the elements are surrounded by an oxidizing atmosphere until the indium alloys to the desired depth with the germanium wafer. In the other of those methods, the indium pellet is brought into contact with the germanium wafer, but instead of employing a flux, the parts are heated to 300° in a hydrogen atmosphere to cause the indium to wet the germanium surface and subsequently the alloying process is carried on at 550° C. in a somewhat oxidizing atmosphere. The disadvantages of those two methods are that they are complicated by (1) the necessity of maintaining the proper type of atmosphere, (2) the difficulties in removing flux residues, and (3) difficulties in removing the charge of gases remaining in and around the jigs when changing from one type of atmosphere to another. The disadvantages of those methods are such that a more satisfactory process is needed.

The present invention has eliminated the necessity of fluxes or special types of atmospheres and makes possible the facile fabrication of transistors having a frequency capability extending to above 100 mc. (megacycles per second).

Figure 3:
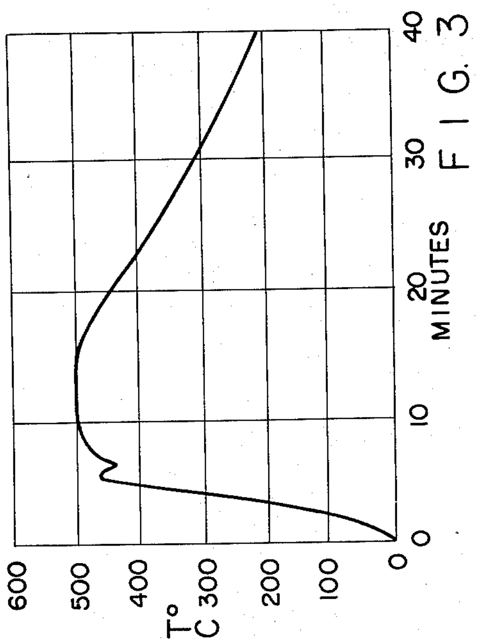
FIG. 3 is a graphical representation of the heating cycle employed in the process.

In accordance with the invention, a globular pellet of acceptor material, of pure solid indium, for example, is placed in a jig and brought into contact with the surface of a crystalline wafer of semi-conductor material, such as germanium. The touching members are then heated for a short time in vacuum ($10^{-5}$ mm. Hg vacuum) in conformity with the heating cycle represented by the graph of FIG. 3. That is, during the first four or five minutes the temperature is raised at a rate of 100° to 120° C. per minute until a temperature slightly below the temperature required for alloying is reached. During that time the acceptor pellet material wets the surface of the semi-conductor wafer and when a sufficient surface area has been wet, the temperature is lowered to some extent (e.g. 20° to 30°) for a minute or two and subsequently the temperature is again raised slowly, at a rate of about 20° C. per minute, until the requisite alloying temperature is attained. When it is reached, the alloying temperature is maintained for a suitable length of time which is determined by the amount of indium to be alloyed. The transistor is then cooled at a maximum rate of 15° C. per minute until it is at 300° C. or thereabouts, and thereafter it is left to cool naturally to room temperature.

In the foregoing process, the indium, during the first stage of the heating cycle, forms an unsaturated shallow alloy layer with the germanium wafer. Later in the heating cycle, the indium further alloys with the germanium until a nearly saturated alloy is obtained. During this later part of the heating cycle, the indium does not spread over the surface of the wafer, but rather the area of the junction is fixed by the area of the surface wet during the initial heating stage. Since the indium does not spread over the germanium surface during the later heating stage, the indium penetrates into the germanium along a planar front during the alloying heat and a flat uniform interface is obtained rather than a convex front. As the process can be carried out in vacuum, any liberated gases can be quickly pumped away so that the recrystallized alloy can be maintained in a uniform condition. Because liberated gases are easily removed before the germanium surface becomes contaminated, the indium uniformly spreads over the germanium surface and there are no unwet areas covered by the indium.

As it is unnecessary to alter the vacuum (or if an inert gas is used, to change the charge of inert gas) during the heating period, a considerable reduction in the complexity of apparatus employed in the process is realized. Moreover, the process requires only one heating cycle rather than the multiple heating and cooling periods now used in other alloy-junction transistor manufacturing methods. As the junction interface formed by this process is limited by the surface of the germanium crystal lattice, the interface tends to form along a supermicroscopic plane.

When a semi-conductor material with a high dislocation density is used, a large number of the crystal dislocations are within the wet surface area, and since the dislocations tend to restrain the spreading of the acceptor pellet over the semi-conductor surface (as is described in patent application No. 3,413,997, filed in Japan on May 6, 1959, on behalf of one of the inventors herein) a better control of the junction area is achieved permitting the production of transistors having uniform high frequency characteristics.

In a specific utilization of the invention, substantially pure indium (99.98% pure) was heated in a vacuum and two globes were obtained, the first ball having a diameter of 0.2 mm. (the emitter pellet) and the second ball having a diameter of 0.3 mm. (the collector pellet). An N-type germanium slab having a resistivity of 0.7 ohm-cm. and a dislocation density of 30,000 p.c.s./cm.$^2$ was shaped to the desired form and polished to a thickness of 150$\mu$ (microns). In the final polishing stage, #4000 Alundum was employed. The germanium slab was then cut into smaller wafers and etched to a thickness of 45$\mu$. A suitable etchant is made by mixing 56 cc. HF (hydrofluoric acid), 56 cc. $HNO_3$ (nitric acid) and 12.5 cc. $H_2O$ (water). The indium pellets were placed in a graphite jig which held those pellets in contact with opposite surfaces of a germanium wafer. The jig was placed in a heating chamber and the chamber evacuated. The parts were heated in conformance with the schedule indicated in FIG. 3 and in accordance with that schedule the maximum temperature was 500° C. (the max. temp. being maintained for six minutes). After cooling to a lower temperature, the base was secured to a support by soldering (with zinc) at a temperature of 350° C. The usual manufacturing steps were then followed in which suitable leads were attached and the transistor was hermetically sealed in a housing. While the heating process is described as performed in vacuum, equivalent results can be obtained with an inert gaseous atmosphere. However, precautions must be taken to insure that the inert gas is of the highest purity to prevent contamination of the germanium wafer's surface.

Figure 4:
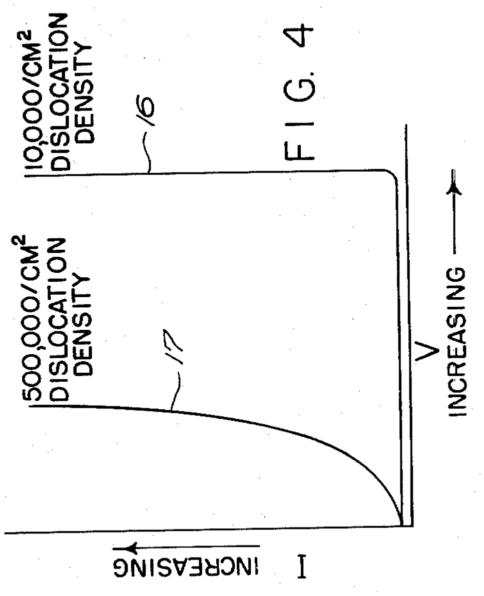
FIG. 4 is a diagram showing the effect of dislocation density on the reverse voltage characteristic of the junction.

In regard to the dislocation density of the semi-conductor wafer, FIG. 4 is a diagram showing the effect of dislocation density on the punch through voltage. The voltage (V) impressed in the reverse direction across the junction is plotted along the abscissa and the resulting current (I) is plotted along the ordinate. It will be observed in comparing curve 16, which represents a low dislocation density semi-conductor (10,000/cm.$^2$) with the curve 17 representing a relatively much higher dislocation density semi-conductor (500,000/cm.$^2$), that the punch through voltage is considerably higher for the semi-conductor having the low dislocation density. In this process, it is desirable to employ a semi-conductor wafer having a dislocation density such that at least four crystal dislocations are present in the wetted area; that is, in the area covered by the alloyed metal. A higher dislocation density permits better control of the junction area because the indium spreads more slowly on the germanium surface. However, that control advantage must be balanced against the lower punch through voltage which is an effect of the higher dislocation density. The dislocation density of the semi-conductor used in the process will, therefore, depend upon the punch through voltage characteristic desired in the transistor and the degree of control to be exercised over the area of the alloy junction.

What is claimed is:

1. A method of forming a rectifying junction comprising the steps of:

(*a*) forming a pellet of substantially pure indium, (*b*) placing the pellet in contact with a planar surface of a wafer of N-type germanium, (*c*) placing the contacting members in a heating chamber, (*d*) evacuating the heating chamber, (*e*) raising the temperature at a rate of about 120° C. per minute until the molten indium pellet wets the germanium surface and forms a shallow unsaturated alloy layer on the wafer, (*f*) reducing the temperature to a heat at which spreading of the indium pellet over the wafer's surface is arrested, (*g*) raising the temperature at a rate of about 20° C. per minute to a temperature of about 500° C., and (*h*) lowering the temperature at a rate not exceeding 15° C. per minute to cause gradual cooling to about 300° F.

2. A method of manufacturing an alloy junction transistor comprising the steps of:

(a) forming two pellets of substantially pure indium, (b) placing the pellets on opposite sides of a wafer of N-type germanium so that the pellets are held in contact with planar germanium surfaces, (c) introducing and maintaining an inert gaseous atmosphere in a chamber in which the assemblage of pellets and wafer have been placed, (d) raising the temperature of the assemblage at a rate of about 120° C. per minute until the molten indium pellets wet the surface of the germanium and form shallow unsaturated alloy layers on the wafer, (e) reducing the temperature to a heat at which further spreading of the indium over the germanium's surface is arrested, (f) raising the temperature at a rate of about 20° C. per minute to a heat at which the indium readily dissolves the germanium, and (g) lowering the temperature to cause the assembly to gradually cool to about 300° C. at a rate not exceeding 15° C. per minute.

References Cited in the file of this patent

UNITED STATES PATENTS

| | | |
|---|---|---|
| 2,788,299 | Dawson et al. | Apr. 9, 1957 |
| 2,850,412 | Dawson et al. | Sept. 2, 1958 |
| 2,900,584 | Bottom | Aug. 18, 1959 |
| 2,932,594 | Mueller | Apr. 12, 1960 |
| 3,009,841 | Faust | Nov. 21, 1961 |

OTHER REFERENCES

"Journal of the Physical Society of Japan, The Migration of Solute Atoms to Dislocation Arrays," Bilby, vol. 10, No. 8, August 1955, pages 673–9.